US006588217B2

(12) United States Patent
Ghoshal (10) Patent No.: US 6,588,217 B2
(45) Date of Patent: Jul. 8, 2003

(54) THERMOELECTRIC SPOT COOLERS FOR RF AND MICROWAVE COMMUNICATION INTEGRATED CIRCUITS

(75) Inventor: Uttam Shyamalindu Ghoshal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/734,519

(22) Filed: Dec. 11, 2000

(65) Prior Publication Data

US 2002/0092307 A1 Jul. 18, 2002

(51) Int. Cl.[7] ............................................... F25B 21/02
(52) U.S. Cl. ................. 62/3.7; 62/3.2; 62/3.4; 62/3.6; 62/259.2
(58) Field of Search ............................ 62/3.2, 3.4, 3.6, 62/3.7, 259.2

(56) References Cited

U.S. PATENT DOCUMENTS

| | | | |
|---|---|---|---|
| 4,141,135 A | | 2/1979 | Henry et al. |
| 5,040,381 A | * | 8/1991 | Hazen .......................... 62/3.2 |
| 5,130,276 A | | 7/1992 | Adams et al. ............... 437/225 |
| 5,279,128 A | | 1/1994 | Tomatsu et al. ............... 62/3.4 |
| 5,655,375 A | * | 8/1997 | Ju ................................ 62/3.6 |
| 5,867,990 A | | 2/1999 | Ghoshal ........................ 62/3.7 |
| 5,895,964 A | | 4/1999 | Nakayama |
| 5,966,940 A | * | 10/1999 | Gower et al. ................. 62/3.3 |
| 5,966,941 A | | 10/1999 | Ghoshal ........................ 62/3.7 |
| 6,000,225 A | | 12/1999 | Ghoshal ........................ 62/3.7 |
| 6,052,559 A | | 4/2000 | Buer et al. |
| 6,112,525 A | * | 9/2000 | Yoshida et al. ................ 62/3.7 |
| 6,161,388 A | | 12/2000 | Ghoshal ........................ 62/3.7 |

FOREIGN PATENT DOCUMENTS

| | | | |
|---|---|---|---|
| DE | 8418025 | 8/1984 | |
| DE | 10009899 | 11/2001 | |
| EP | 0 667 498 A1 | 8/1995 | ........... F25B/21/02 |
| JP | 61172358 | 4/1986 | |
| JP | 05039966 | 2/1993 | ........... F25B/21/02 |
| JP | 05172424 | 7/1993 | ........... F25B/21/02 |
| JP | 09064255 | 7/1997 | |
| WO | WO 94/28364 | 12/1994 | ........... F25B/21/02 |
| WO | WO 00/08693 | 2/2000 | ........... H01L/35/34 |

OTHER PUBLICATIONS

Tony Kontzer, *Can Chip Hot Spots be Cooled Efficiently?*, Informationweek.com NewsFlash, Monday, March 26, 2001, wysiwyg://2/http://www.informationweek.com/story/1WK20010326S00, pp 1–2.

(List continued on next page.)

*Primary Examiner*—William C. Doerrler
*Assistant Examiner*—Mark S. Shulman
(74) *Attorney, Agent, or Firm*—Duke W. Yee; Casimer K. Salys; Stephen R. Loe (57) ABSTRACT

An apparatus for cooling selected elements within an integrated circuit, such as active transistors or passive circuit elements used in a radio frequency integrated circuit is provided. In one embodiment, the cooling apparatus includes a cold plate thermally coupled to the region proximate the integrated circuit element, a thermoelectric cooler thermally coupled to the cold plate; and a hot plate thermally coupled to the thermoelectric cooler. Heat is removed from the integrated circuit element through the cold plate and transmitted to the hot plate through the thermoelectric cooler. In one form, the hot plate is located or coupled to an exterior surface of an integrated circuit, such that heat transmitted to the ambient from the integrated circuit element is dissipated into the atmosphere surrounding the integrated circuit. In another form, the hot plate is embedded in the integrated circuit substrate to locally cool elements of the integrated circuit while dumping the heat into the substrate.

33 Claims, 6 Drawing Sheets

OTHER PUBLICATIONS

Rinzler et al., "Large–Scale Purification of Single–Wall Carbon Nanotubes: Process, Product, and Characterization", Applied Physics A, 1998, pp. 29–37.

Smalley, Tubes@Rice, http://cnst.rice.edu/tubes/, Apr. 8, 1999, 8 pages.

Http://www.tellurex.com/resource/txfaqc.htm, Aug. 15, 1999, pp. 1–30.

Http://www.tellurex.com/resource/introc.htm, Aug. 15, 1999, pp. 1–7.

Liu et al., "Fullerene Pipes", www.sciencemag.org, *Scienc*, vol. 280, May 22, 1998, pp. 1253–1255.

Thess et al., "Crystalline Ropes of Metallic Carbon Nanotubes", *Science*, vol. 273, Jul. 26, 1996, pp. 483–487.

\* cited by examiner

THERMOELECTRIC SPOT COOLERS FOR RF AND MICROWAVE COMMUNICATION INTEGRATED CIRCUITS

BACKGROUND OF THE INVENTION

1. Technical Field

The present invention is generally related to the field of integrated circuits and, more particularly, to a method and apparatus for cooling integrated circuits.

2. Description of Related Art

The use of radio frequencies (RF) and microwave frequencies have been utilized for most of the $20^{th}$ century to provide communications. Early uses of RF and microwave technologies involved radio communications, both broadcast and two-way communication, and radar for detecting incoming aircraft. Much of this early technology was developed the 1940's to help in fighting World War II.

After the war, RF and microwave technologies were extended into other communication areas. Telephone companies used microwave technologies to carry voice communications across areas in which it was impractical to build transmission lines, such as, for example, in vary mountainous terrain. RF frequencies were also used by the emerging television industry to carry television broadcasts to peoples' homes where their television sets received the broadcast signal.

More recently, RF transmissions have been used to carry satellite signals, both for military and commercial use as well as, more recently, for delivering television content to subscriber's homes as well as access to the Internet. RF and microwave frequencies are also used to provide wireless (cellular) telephone services, these services include analog, digital and personal communication services (PCS).

The transmission capacity of an electronic communications through RF transmissions is determined by the range of the frequency signals (bandwidth), and the number of channels in the bandwidth. It is expressed in bits per second, bytes per second or in Hertz (cycles per second). As more and more information is being transmitted through RF circuits, a need for greater bandwidth has developed to handle this increase in information transmittal. However, the bandwidths and channel capacity of RF, cellular, and microwave systems are limited by the signal-to-noise (S/N) ratios of the amplification and filtering process within the system. One important method to increase the S/N ratios is to reduce the thermal noise by lowering the operating temperature of the circuits. Therefore, it would be desirable to have an apparatus, system, and method for cooling RF circuits such that the bandwidths and channel capacity of the RF circuits could be increased.

SUMMARY OF THE INVENTION

The present invention provides an apparatus for cooling an integrated circuit component, such as a field effect transistor circuit used in a radio frequency transistor or receiver. In one embodiment, the cooling apparatus includes a cold plate thermally coupled to the integrated circuit component, a thermoelectric cooler thermally coupled to the cold plate; and a hot plate thermally coupled to the thermoelectric cooler. Heat is removed from the integrated circuit component through the cold plate and transmitted to the hot plate through the thermoelectric cooler. The hot plate is located at a surface of an integrated circuit such that heat transmitted to it from the integrated circuit component is dissipated into the atmosphere surrounding the integrated circuit chip.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1A:
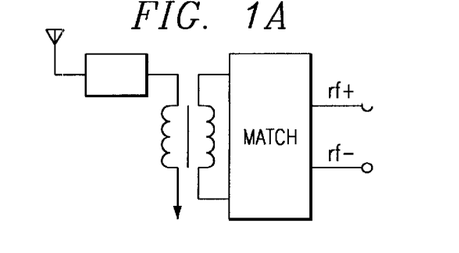
FIGS. 1A–1E depict circuit diagrams of examples of typical radio frequency (RF) circuits that benefit from cool operation.
Figure 1B:
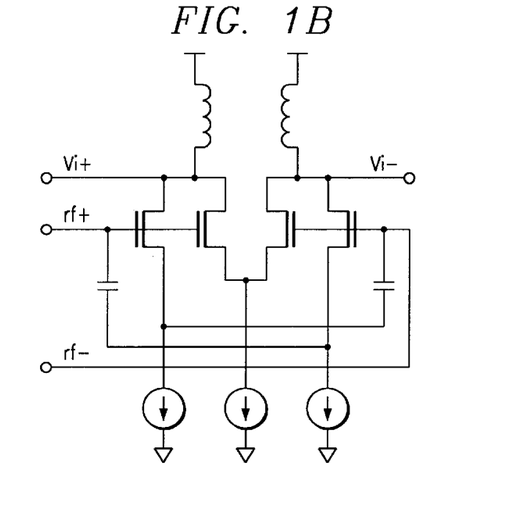
Figure 1C:
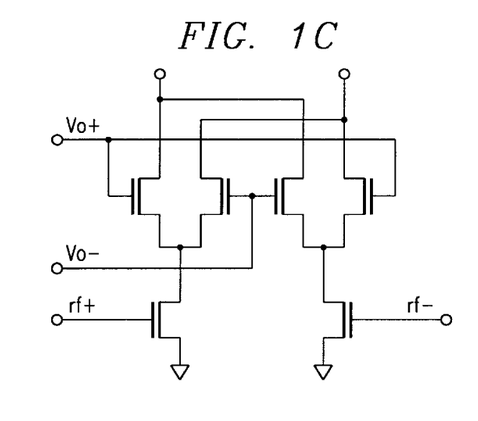
Figure 1D:
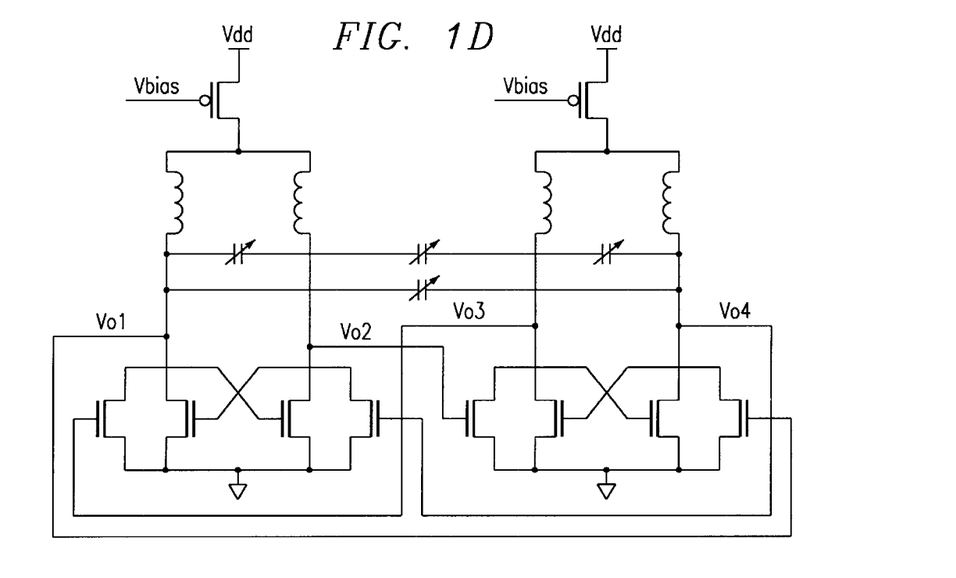
Figure 1E:
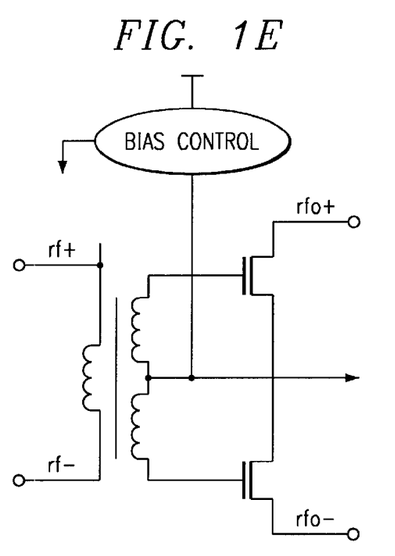

With reference now to the figures and, in particular, with reference to FIGS. 1A–1E, circuit diagrams of examples of typical radio frequency (RF) circuits that benefit from cool operation are depicted. FIG. 1A depicts an example of a passive antenna system. FIG. 1B depicts an example of input low noise amplifiers (LNAs). FIG. 1C depicts an example of the mixer stages in an RF circuit. FIG. 1D depicts an example of a quadrature oscillator. FIG. 1E depicts an example of a power amplifier (PA) at the output. The channel selectivity of these circuits and the filters employed in the signal path are determined by the quality factor of the passive inductors and capacitors, and the thermal noise voltages in the transistors. Both the quality factor and thermal noise voltages are strongly dependent on the operating temperature.

Figure 2:
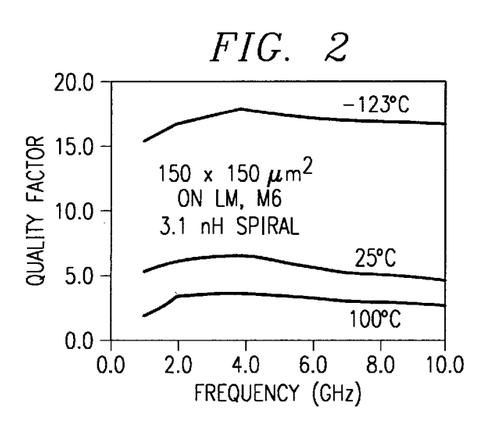
FIG. 2 depicts a graph of a typical temperature dependency of the quality factor of on-chip spiral inductors.

With reference now to FIG. 2, a graph of a typical temperature dependency of the quality factor of on-chip spiral inductors is depicted. The graph depicted in FIG. 2 relates the quality factor of a 150×150 $\mu m^2$ 3.1 nanoHenry (nH) spiral inductor coil implemented in the clock generator of a CMOS test chip versus the frequency of operation in gigahertz. (GHz) for three temperatures. As shown in FIG. 2, the quality factor for the spiral inductor coil rises continuously as the temperature of the inductor is decreased for all frequencies of operation. For an inductor temperature of 100 degrees Celsius, the quality factor of the inductor coils is approximately in the range of 2–3 over the frequency range of 1.0 to 10.0 GHz. As the temperature of the inductor coils is decreased to 25 degrees Celsius, the quality factor increases to approximately 5.0 for the same frequency range. As the temperature of the inductor coils is further decreased to −123 degrees Celsius, the quality factor increases even further to approximately 15.0 to 18.0 over the same range of frequencies. Thus, a significant benefit is achieved by reducing the operating temperature of the inductive coils. Similar benefits in temperature reduction or achieved with other RF circuits.

The phase noise, L, of the oscillators are also directly affected by the operating temperature of the circuit. The temperature dependence of the phase noise of the oscillators are given by the following equation:

$$L\{\Delta\omega\} = \frac{kT \cdot R \cdot F \cdot \left(\frac{\omega_0}{\Delta\omega}\right)^2}{P_{signal}}$$

where

R=effective resistance of the (LC) tank (temperature dependent)

$\omega_0$=center frequency of oscillation $\Delta\omega$=frequency offset

F=term related to noise from active devices $P_{signal}$=power level of oscillation T=the absolute operating temperature in kelvins From this equation, it is evident that phase noise increases as the temperature of the oscillators increase. Therefore, it is beneficial to have an oscillator operating at lower temperatures to decrease the amount of phase noise.

Figure 3:
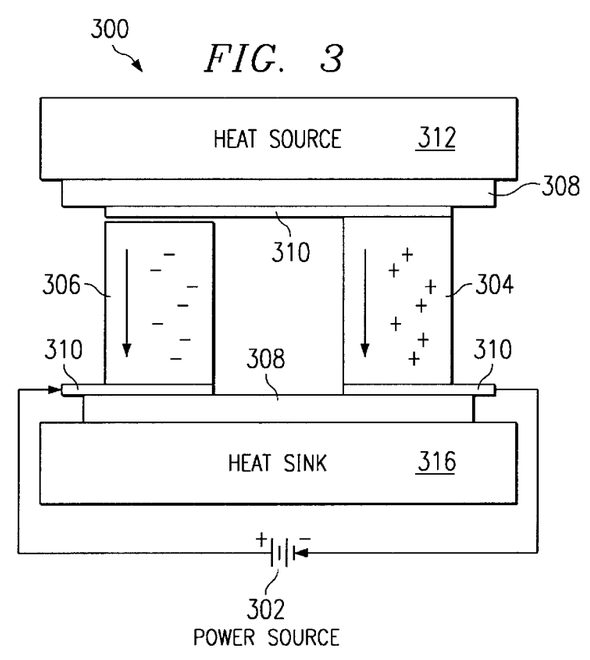
FIG. 3 depicts a high-level block diagram of a Thermoelectric Cooling (TEC) device in accordance with the present invention.

With reference to FIG. 3, a high-level block diagram of a Thermoelectric Cooling (TEC) device 300 is depicted in accordance with the present invention. TEC device 300 is preferably connected to the integrated circuit device near the temperature sensitive element. Thermoelectric cooling, a well known principle, is based on the Peltier Effect, by which DC current from power source 302 is applied across two dissimilar materials causing heat to be absorbed at the junction of the two dissimilar materials. A typical thermoelectric cooling device utilizes p-type semiconductor 304 and n-type semiconductor 306 sandwiched between poor electrical conductors 308 that have good heat conducting properties.

As electrons move from p-type semiconductor 304 to n-type semiconductor 306 via electrical conductor 310, the energy state of the electrons is raised due to heat energy absorbed from heat source 312. This process has the effect of transferring heat energy from heat source 312 via electron flow through p-type semiconductor 304 and electrical conductor 310 to heat sink 316. The electrons drop to a lower energy state in the electrical conductor 310 and release the heat energy.

Figure 4:
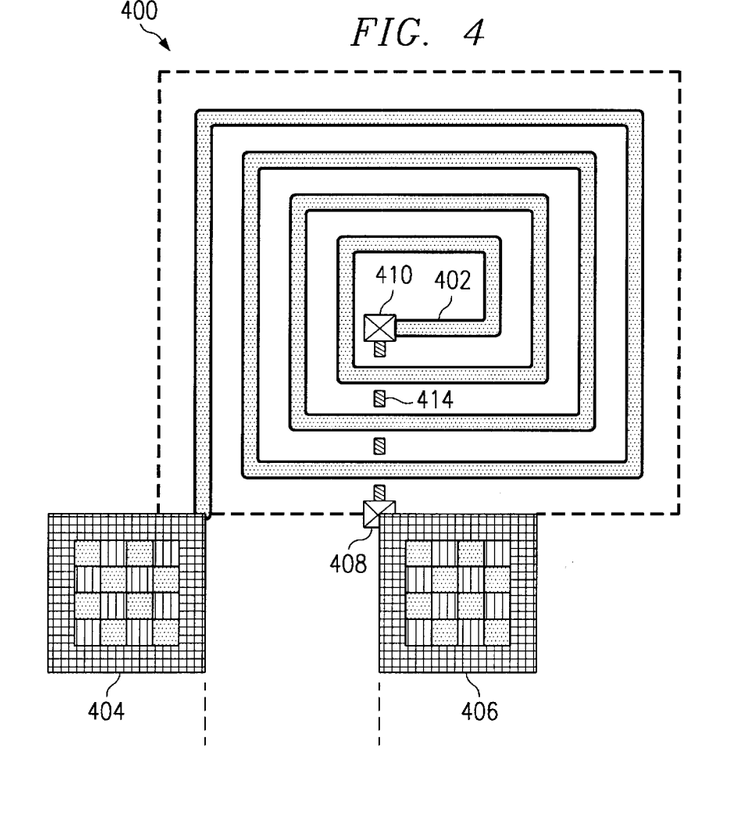
FIG. 4 depicts a top planar view of direct coupled coolers for cooling IC RF circuits in accordance with the present invention.

With reference now to FIG. 4, a top planar view of direct coupled coolers for cooling IC RF circuits is depicted in accordance with the present invention. Integrated circuit 400 includes two coolers 404 and 406 thermally coupled to passive spiral coil 402. Coolers 404 and 406 may be implemented as, for example, TEC device 300 in FIG. 3. In this embodiment, the cold plate of cooler 406 is coupled directly to one end of the passive spiral coils 402 using via structures 408 and 410. Via structures 408 and 410 and lower level interconnect 414 are preferably thermally and electrically conductive copper composition. The cold plate of cooler 404 is directly thermally coupled to the other end 420 of spiral coil 402, preferably also of a copper composition.

Portions of coolers 404 and 406 as well as the spiral coil 402 are constructed within the same layer of the integrated circuit 400. The interconnect 414 is constructed in a lower layer of the integrated circuit 400 from that of the spiral coil 402. Although depicted using two coolers 404–406 to cool spiral coil 402, a single cooler could be utilized as well. However, the two coolers working in tandem provide greater cooling of the spiral coil 402 than would a single cooler and help reduce any thermal gradient between different sections of the spiral coil 402.

Electrical isolation between cooler 406 and passive spiral coil 402 may be achieved by using current-mode circuits or by using ultra-thin dielectric passivation layers such as chemical vapor deposition (CVD) silicon dioxide or anodized aluminum. Anodization of aluminum is preferable to CVD silicon dioxide because 1–10 nanometer (nm) dielectric layers can be easily formed, and the thermal conductivity of alumina (aluminum oxide) is better than that of silicon dioxide.

Figure 5:
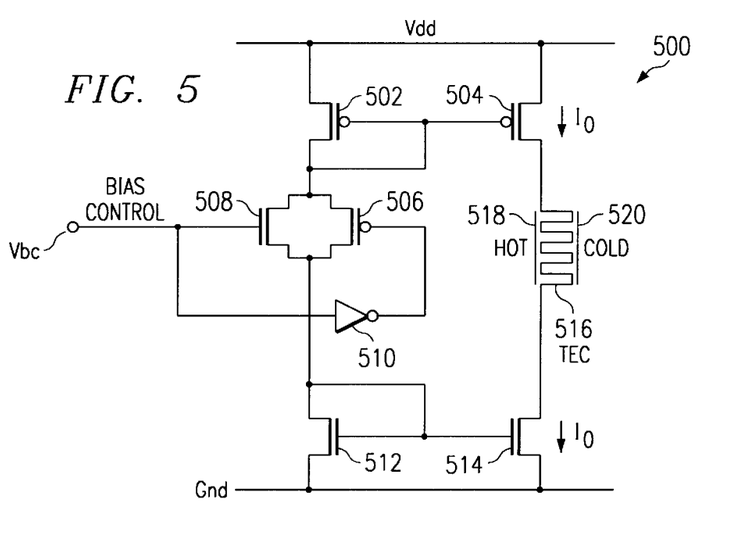
FIG. 5 depicts a current-controlled thermoelectric cooler (TEC) circuit in accordance with the present invention.

With reference now to FIG. 5, a current-controlled thermoelectric cooler (TEC) circuit is depicted in accordance with the present invention. Current-controlled TEC circuit 500 is an example of a current-mode circuit which may be used in conjunction with direct-coupled coolers 400 in order to maintain electrical isolation of the coolers 404–406 from passive spiral coil 402. Current-controlled TEC circuit 500 includes p-channel field effect transistors 502–506, n-channel transistors 508, inverter 510, and 512–514, and TEC 516. TEC 516 has a hot end 518 for dissipating heat and a cold end 520 which is thermally coupled to the device to be cooled.

The gate of transistor 508 is coupled to a bias control voltage $V_{bc}$ as well as to the input of inverter 510. The output of inverter 510 is coupled to the gate of transistor 506. The drain of transistor 506 and the drain of transistor 508 are coupled to the source of transistor 512 and to the gates of transistors 512–514, so that transistors 512 and 514 are in a current mirror configuration. The drains of transistors 512–514 are coupled to ground $G_{nd}$. The source of transistor 514 is coupled to a second end of TEC 516. Thus, current-controlled TEC circuit 500 maintains a constant current flow $I_0$ through TEC 516 based upon bias voltage $V_{bc}$. Even if the cold end 520 of the TEC 516 is electrically connected to the device, by Kirchoff's law, there is no current flowing between the TEC 516 and the device. Thus the current-mode bias circuit 500 ensures electrical isolation for the TEC 516.

Figure 6A:
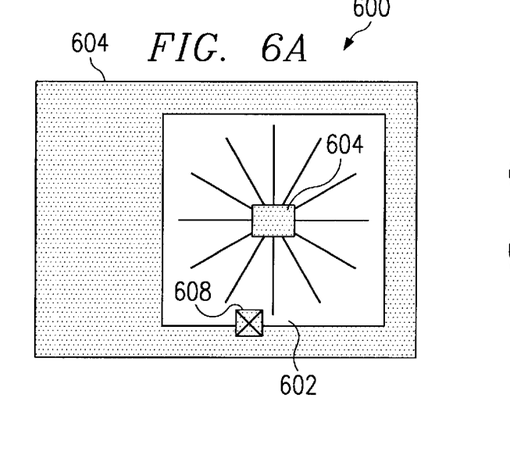
FIGS. 6A–6B depict top cut-away planar and cross-sectional views of a patterned cold plate for cooling RF IC circuits in accordance with the present invention.
Figure 6B:
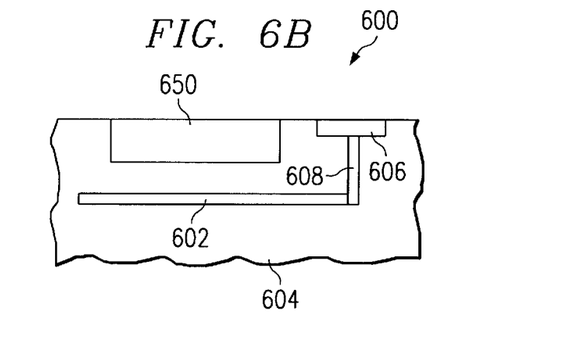

With reference now to FIGS. 6A and 6B, FIG. 6A depicts a top planar view of a patterned cold plate in an integrated circuit chip for cooling RF IC circuits and FIG. 6B depicts a cross-sectional view of the section of the integrated circuit chip in accordance with the present invention. In this embodiment, as an alternative to using direct-coupled coolers as depicted in FIG. 4, a cold plate 602 is placed underneath the RF circuit 650, such as, for example, one of the RF circuits depicted in FIGS. 1–5. By placing cold plate 602 under the RF circuits 650, large areas of inductors and capacitors within the RF circuit 650 are cooled. However, cold plate 602 is not physically in contact with any of the circuits within RF circuits 650 but is separated by an dielectric material 604. Cold plate 602 is thermally coupled to the thermoelectric cooler 606 by via thermal conductor 608.

If cold plate 602 is constructed from metal and is used under the inductors within the RF circuit 650, then cold plate 602 is patterned to avoid the inducement of circulating eddy currents in the metal layer resulting from magnetic coupling with the inductors.

The integrated chip 600 may contain other areas other than the RF circuits 650 that do not generate an excessive amount of heat and do not need to be cooled. Thus, an efficiency in power savings is achieved by the present invention by spot cooling only the portions (i.e. RF circuits 650) of the integrated circuit 600 that generate significant heat and need to be cooled.

Figure 7A:
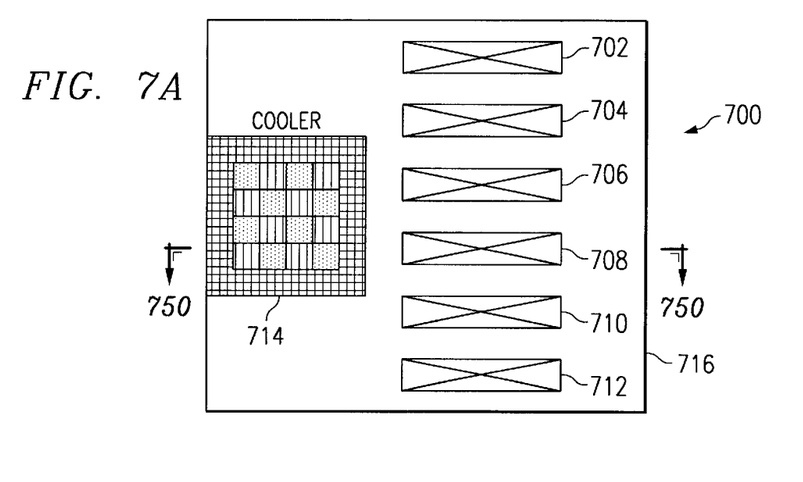
FIGS. 7A–7B depicts top cut-away planar and cross-sectional views illustrating direct thermal coupling of a cooler with the LNA/PA and body/substrate levels of an integrated circuit (IC) in accordance with the present invention.
Figure 7B:
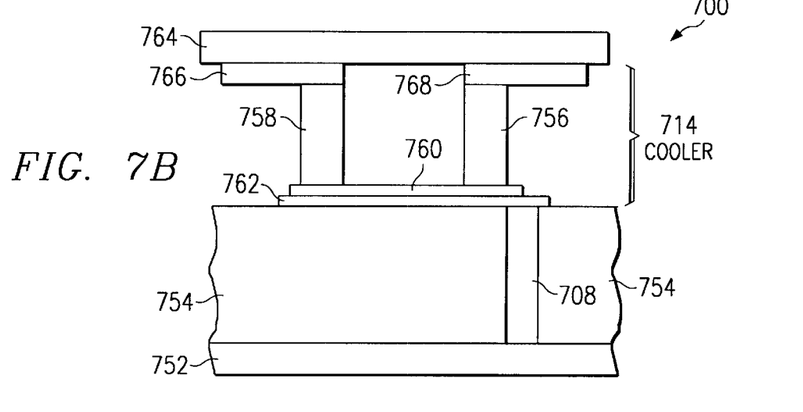

With reference now to FIGS. 7A and 7B, FIG. 7A depicts a top cut-away planar view illustrating direct thermal coupling of a TEC cooler through the body/substrate levels of an integrated circuit (IC) and FIG. 7B depicts a cross-sectional view along cut 750 of the direct thermal coupling of the TEC cooler through the body/substrate levels of an integrated circuit (IC) in accordance with the present invention. Vias 702–712 thermally couple a cold plate 762 of the IC 700 to the body/substrate level 752 of IC 700. Body/substrate level 752 may contain low-noise amplifier circuits. The cold plate 762 of TEC cooler 714 is separated from the body/substrate level 752 of IC 700 by intervening metalization and/or oxide layers 754.

An electrical conductor 760 couples the p-type impurity thermoelement 758 to the n-type impurity thermoelement 756 thus allowing current to flow from electrical conductor 768 through thermoelements 756 and 758 and out through electrical conductor 766. An electrically isolating, thermally conducting hot plate 764 is in physical contact with electrical conductors 766–768 allowing heat to flow from thermoelements 756–758 into hot plate 764, where the heat may then be dissipated.

Figure 8:
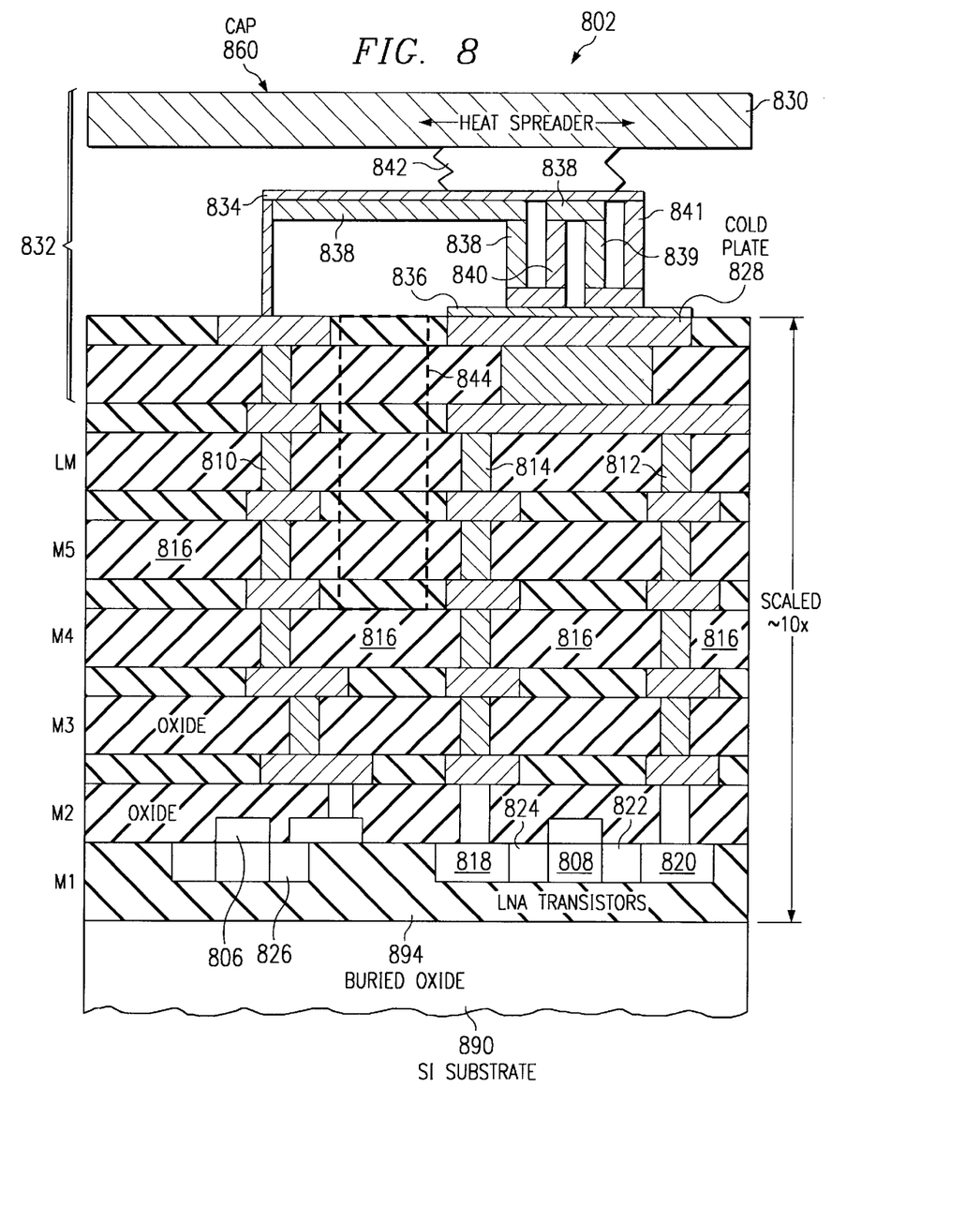
FIG. 8 depicts a cross sectional view of an exemplary thermoelectric spot cooler fabricated over an RF CMOS IC in accordance with the present invention.

With reference now to FIG. 8, a cross sectional view of an exemplary thermoelectric spot cooler fabricated over an RF CMOS IC is depicted in accordance with the present invention. In this exemplary embodiment, integrated circuit (IC) chip 800 includes a low noise amplifier (LNA) transistor 808 which is formed as a silicon-on-insulator (SOI) transistor in buried oxide 894 that lies above a silicon substrate 890. A thermoelectric cooler (TEC) 832 is placed above LNA transistor 808 for cooling LNA transistor 808. A second transistor 806 to provide a current source for TEC 832 is also formed as an SOI transistor in buried oxide 894. A conductive via structure 810 through oxide layers 816 couples the drain 826 of transistor 806 to TEC 832 to provide current to the p-type 838 and n-type 840 semiconductor material of TEC 832. P-type 838 and n-type 840 semiconductor areas provide a similar function as p-type semiconductor 304 and n-type semiconductor 306 in FIG. 3.

The heat spreader 830, which acts as a heat sink, such as, for example, heat sink 316 in FIG. 3, for dissipating heat is thermally but not electrically coupled to the hot side element of TEC 832 through layer 834. Layer 834 may be constructed, for example, from ultra-thin oxide or alumina. Heat spreader 830 could be coupled to layer 834 by solder.

N-type semiconductor 840 is thermally coupled to cold plate 828 through thin layer 836. Layer 836 may also be constructed, for example, from ultra-thin oxide or alumina.

Cold plate 828 is thermally coupled to both the drain 824 and source 822 of transistor 808 through oxide layers 816 by using vias 814 and 812 respectively. Vias 812 and 814, as well as via 810 are typically constructed from metal, such as, for example, copper (Cu) or tungsten (W), and are both good electrical and thermal conductors. Via 814 is thermally coupled to drain 824 through diffused region 818, of an impurity type opposite drain diffusion 824, which provides a thermal connection while maintaining electrical isolation of via 814 and cold plate 828 from drain 824. Via 812 is thermally coupled to source 822 through a similarly diffused region 820 which provides a thermal connection while maintaining electrical isolation of via 812 and cold plate 828 from source 822.

Thus, as heat is built up in transistor 808 by RF operation, the heat is carried away through vias 812 and 814 to cold plate 828 of TEC 832. The heat is then transferred from cold plate 828 to heat spreader 830 where it may be dissipated away from the IC chip 800.

Optionally, a reactive ion etch (RIE) etch of section 844 can be performed. The RIE etch forms a trench in section 844 which aids in ensuring further thermal isolation of cold plate 828 from via 810, which is connected to hot plate 838.

The structure depicted in FIG. 8 is given as an example of a thermoelectric spot cooler directly coupled to an RF IC device and is not intended to limit the present invention. For example, more or fewer metallization layers M1–M5, and LM may be utilized between the RF device, such as, for example, transistor 808 and cold plate 828. Furthermore, transistor 808 may be any single or composite temperature sensitive device without departing from the scope and spirit of the present invention. Also, it should be noted that the present invention is not limited to RF transistors constructed as SOI transistors, but may be applied to bulk transistors and event to RF devices other than transistors. Furthermore, the elements of IC chip 802 may be constructed from other substances and compounds than those depicted.

Figure 9:
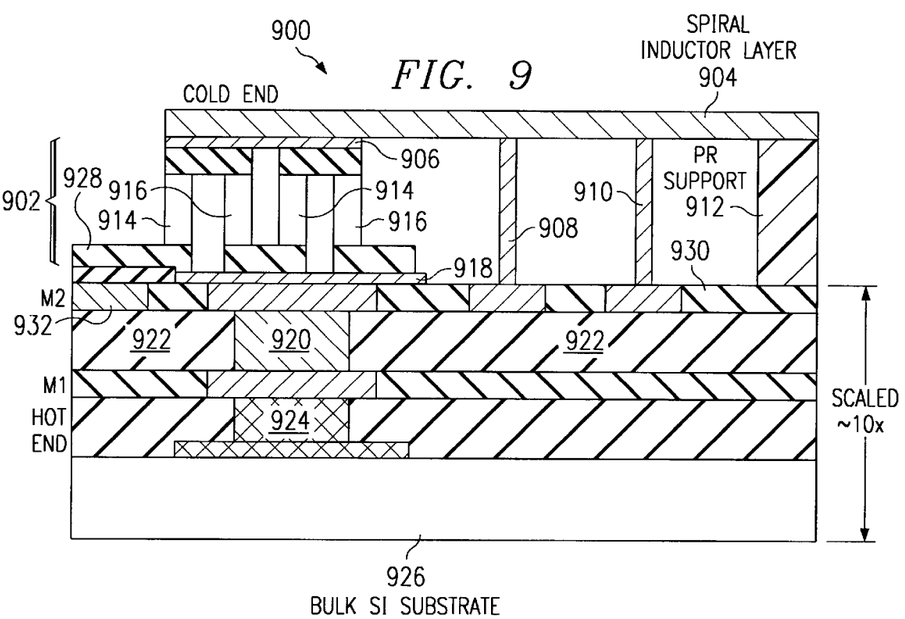
FIG. 9 depicts a cross sectional view of an exemplary RF spiral inductor circuit wherein the thermoelectric cooler is incorporated in the passive inductor and the heat is rejected into the bulk substrate in accordance with the present invention.

With reference now to FIG. 9, a cross sectional view of an exemplary RF spiral inductor circuit wherein the thermoelectric cooler is incorporated in the passive inductor and the heat is rejected into the bulk substrate is depicted in accordance with the present invention. IC chip 900 includes spiral inductors having components 908 and 910 visible in the depicted view. Spiral inductor components 908 and 910 are formed from an electrically conductive material such as, for example, copper (Cu). Spiral inductor is formed in the cold end 904 and the inductor leads 908 and 910 of the inductor components are thermally coupled to cold end 904 which in turn is supported in part above the surface 930 of IC chip 900 by photoresist (PR) support 912.

Thermoelectric cooler 902 includes a thin electrically but not thermally conducting layer 906 to couple cold end 904 to the cold ends of p-type element 914 and n-type element 916 of the TEC. Current to drive the TEC is provided through conductor 932, which in the depicted example, lies in the second metallization layer M2. Thermoelectric cooler 902 also includes a second thin thermally but not electrically conductive layer 918 to provide a thermal coupling to via 920. Via 920 then provides a thermal connection through oxide layers 922 to hot end 924 at substrate 926. As heat is generated in the spiral inductor, it is transported by TEC 902 from cold end 904 to hot end 924 and into the bulk silicon substrate 926, thus cooling the spiral inductor.

Although the present invention has been described primarily with reference to dissipating the heat either into the bulk substrate or into the atmosphere surrounding the integrated circuit via a hot plate located the surface of the integrated circuit, the heat may also be dissipated by other means. For example, the heat may be rejected via heat pipes rather than directly in air. Furthermore, the thermoelectric coolers are not limited to a single type of thermoelectric cooler, but may be implemented as any one of several different types of thermoelectric coolers, such as, for example, quantum point coolers.

It should also be noted that the present invention allows metal structures with photoresist or dielectric supports to be easily incorporated in the cooling process. Furthermore, it should also be noted that the present invention is not limited by the exemplary structure depicted and that there are a large number of alternative structures which may be utilized without departing from the scope and spirit of the present invention.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An apparatus for cooling an element of an integrated circuit, comprising:
    a cold plate thermally coupled to a selected element within the integrated circuit through a path defined by at least one patterned integrated circuit layer;
    a thermoelectric cooler thermally coupled to the cold plate; and
    a hot plate thermally coupled to the thermoelectric cooler; wherein
       heat is selectively removed from the selected element within the integrated circuit through the cold plate and transmitted to the hot plate through the thermoelectric cooler; and
       the hot plate is exposed at a surface of the integrated circuit to dissipate heat into the surrounding atmosphere.

2. The apparatus as recited in claim 1, wherein current is provided to the thermoelectric cooler from a field effect transistor within the integrated circuit, said drain being electrically coupled to said thermoelectric cooler by a via structure.

3. The apparatus as recited in claim 1, wherein the cold plate is thermally coupled to the selected element within the integrated circuit by a thermal conductor, the thermal conductor providing at least partial electrical isolation of the cold plate from the selected element of the integrated circuit.

4. The apparatus as recited in claim 1, wherein the selected element within the integrated circuit is a transistor and the cold plate is thermally coupled to both a drain and a source of the transistor.

5. The apparatus as recited in claim 4, wherein the transistor is a low noise amplifier transistor.

6. The apparatus as recited in claim 4, wherein the transistor is a silicon-on-oxide transistor.

7. The apparatus as recited in claim 1, wherein the selected element within the integrated circuit is a capacitor.

8. The apparatus as recited in claim 1, wherein the selected element within the integrated circuit is an inductor.

9. The apparatus as recited in claim 1, wherein the selected element within the integrated circuit is utilized in a radio frequency circuit.

10. The apparatus as recited in claim 1, wherein the thermoelectric cooler is a quantum point cooler.

11. An apparatus for cooling an element of an integrated circuit, comprising:
    a cold plate thermally coupled to a selected element within the integrated circuit;
    a thermoelectric cooler thermally coupled to the cold plate; and
    a hot plate thermally coupled to the thermoelectric cooler; wherein
       the hot plate is thermally coupled to sink heat into a bulk substrate within the integrated circuit; and
       heat from the integrated circuit element is transported from the cold plate through the thermoelectric cooler and dissipated into the bulk substrate through the hot plate.

12. The apparatus as recited in claim 11, wherein the integrated circuit element is an inductor.

13. The apparatus as recited in claim 12, wherein the inductor is a spiral inductor.

14. The apparatus as recited in claim 11, wherein the cold plate is partially supported away from a surface of the integrated circuit element by a support.

15. The apparatus as recited in claim 14, wherein the support comprises photoresist.

16. The apparatus as recited in claim 11, wherein the integrated circuit element is utilized within a radio frequency circuit.

17. The apparatus as recited in claim 16, wherein the radio frequency circuit comprises an antenna.

18. The apparatus as recited in claim 16, wherein the radio frequency circuit comprises a passive antenna.

19. The apparatus as recited in claim 16, wherein the radio frequency circuit comprises a low noise amplifier.

20. The apparatus as recited in claim 16, wherein the radio frequency circuit comprises a mixer.

21. The apparatus as recited in claim 16, wherein the radio frequency circuit comprises a quadrature oscillator.

22. The apparatus as recited in claim 16, wherein the radio frequency circuit comprises a power amplifier.

23. The apparatus as recited in claim 11, wherein the thermoelectric cooler is a quantum point cooler.

24. An apparatus for cooling an element of an integrated circuit, comprising:
    a cold plate thermally coupled to a selected element within the integrated circuit through a path defined by at least one patterned integrated circuit layer;
    a thermoelectric cooler thermally coupled to the cold plate; and
    a hot plate thermally coupled to the thermoelectric cooler; wherein
       heat is selectively removed from the selected element within the integrated circuit through the cold plate and transmitted to the hot plate through the thermoelectric cooler; and
       the hot plate is coupled to a passive element for dissipating heat.

25. The apparatus as recited in claim 24, wherein current is provided to the thermoelectric cooler from a field effect transistor within the integrated circuit, said drain being electrically coupled to said thermoelectric cooler by a via structure.

26. The apparatus as recited in claim 24, wherein the thermoelectric cooler is a quantum point cooler.

27. An integrated circuit structure, comprising:
    a thermoelectric cooler formed in a plurality of first layers of the integrated circuit structure;
    a circuit component formed in at least one second layer of the integrated circuit structure;
    a cold plate formed in a third layer of the integrated circuit structure thermally coupled to at least a portion of the circuit component through a path defined by at least one patterned integrated circuit layer and thermally coupled to the thermoelectric cooler; and a hot plate formed in a fourth layer of the integrated circuit structure thermally coupled to the thermoelectric cooler and electrically isolated from the circuit component, wherein heat is selectively removed from the circuit component and transferred to the hot plate.

28. The integrated circuit structure as recited in 27, wherein at least one of the plurality of first layers comprise the at least one second layer.

29. The integrated circuit structure as recited in claim 27, wherein the circuit component comprises an inductor.

30. The integrated circuit structure as recited in claim 27, wherein the circuit component comprises a transistor.

31. The integrated circuit structure as recited in claim 30, wherein the cold plate is thermally coupled to two electrodes of the transistor.

32. The integrated circuit structure as recited in claim 31, wherein the hot plate is thermally coupled to the integrated circuit substrate and heat transferred from the circuit component to the hot plate is dissipated in the integrated circuit substrate.

33. The integrated circuit structure as recited in claim 27, wherein the hot plate dissipates heat into a surrounding atmosphere.

* * * * *